United States Patent
Li

(10) Patent No.: US 8,708,532 B2
(45) Date of Patent: Apr. 29, 2014

(54) LIGHT-EMITTING DEVICE

(76) Inventor: Syue-Min Li, Taipei (TW)

(*) Notice: Subject to any disclaimer, the term of this patent is extended or adjusted under 35 U.S.C. 154(b) by 354 days.

(21) Appl. No.: 13/342,632

(22) Filed: Jan. 3, 2012

(65) Prior Publication Data

US 2012/0170276 A1    Jul. 5, 2012

(30) Foreign Application Priority Data

Jan. 5, 2011 (TW) .............................. 100100443 A

(51) Int. Cl.
*F21V 29/00* (2006.01)
*F21V 7/06* (2006.01)
*H01L 33/48* (2010.01)
*H01L 33/60* (2010.01)
*F21K 99/00* (2010.01)

(52) U.S. Cl.
CPC .............. *H01L 33/486* (2013.01); *H01L 33/60* (2013.01); *F21K 9/00* (2013.01)
USPC ...................................... 362/296.07; 362/294

(58) Field of Classification Search
None
See application file for complete search history.

(56) References Cited

U.S. PATENT DOCUMENTS

| | | | |
|---|---|---|---|
| 6,578,998 B2 * | 6/2003 | Zhang | 362/555 |
| 6,729,746 B2 * | 5/2004 | Suehiro et al. | 362/241 |
| 6,833,566 B2 * | 12/2004 | Suehiro et al. | 257/99 |
| 7,271,423 B2 * | 9/2007 | Hanamoto et al. | 257/98 |
| 7,382,091 B2 * | 6/2008 | Chen et al. | 313/512 |
| 2002/0024808 A1 * | 2/2002 | Suehiro et al. | 362/245 |
| 2002/0063301 A1 * | 5/2002 | Hanamoto et al. | 257/432 |
| 2002/0139990 A1 * | 10/2002 | Suehiro et al. | 257/99 |
| 2004/0173808 A1 * | 9/2004 | Wu | 257/99 |

* cited by examiner

*Primary Examiner* — Britt D Hanley
(74) *Attorney, Agent, or Firm* — Rajesh Vallabh; Foley Hoag LLP

(57) ABSTRACT

A light-emitting device includes: a transparent substrate including a mounting surface, a circuit path formed on the mounting surface, and two opposite contacts formed on the mounting surface; a light-emitting diode chip that includes two electrodes and that is mounted on the mounting surface; and a reflecting cup disposed on the mounting surface to cover the light-emitting diode chip. The reflecting cup is formed with an inner recess that faces the mounting surface, and a reflecting layer formed on a recess-defining wall that defines the inner recess. The reflecting layer is capable of reflecting light from the light-emitting diode chip toward the transparent substrate.

7 Claims, 3 Drawing Sheets

LIGHT-EMITTING DEVICE

CROSS-REFERENCE TO RELATED APPLICATION

This application claims priority Taiwanese application no. 100 00443, filed on Jan. 5, 2011.

BACKGROUND OF THE INVENTION

1. Field of the Invention

The present invention relates to a light-emitting device, more particularly to a light-emitting device having enhanced brightness.

2. Description of the Related Art

Referring to FIGS. 1 and 2, a conventional light-emitting device generally comprises a light-emitting diode chip 1, electrodes 11, and conductive wires 12 for electrically connecting the electrodes 11 to other electrical components. The light-emitting chip 1 has a main light-emitting surface 10 on which one of the electrodes 11 is disposed. Therefore, at least about 30% of light emitted from the main light-emitting surface 10 may be obstructed by the electrode 11 and the conductive wire 12 and can not be completely utilized. On the other hand, the light emitted from other five surfaces of the light-emitting diode chip 1, i.e., the surfaces other than the main light-emitting surface 10, can not be efficiently utilized. Therefore, it is desirable to provide a light-emitting device that has effective light utilization.

SUMMARY OF THE INVENTION

Therefore, the object of the present invention is to provide a light-emitting device that can overcome the aforesaid drawbacks associated with the prior art.

Accordingly, a light-emitting device of the present invention comprises: a transparent substrate including a mounting surface, a circuit path formed on the mounting surface, and two opposite contacts formed on the mounting surface to respectively connect to two opposite ends of the circuit path; a light-emitting diode chip that includes two electrodes and that is mounted on the mounting surface such that the electrodes are electrically connected to the circuit path; and a reflecting cup disposed on the mounting surface to cover the light-emitting diode chip in a manner that the contacts are exposed from the reflecting cup, the reflecting cup being formed with an inner recess that faces the mounting surface, and a reflecting layer formed on a recess-defining wall that defines the inner recess, the reflecting layer being capable of reflecting light from the light-emitting diode chip toward the transparent substrate.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
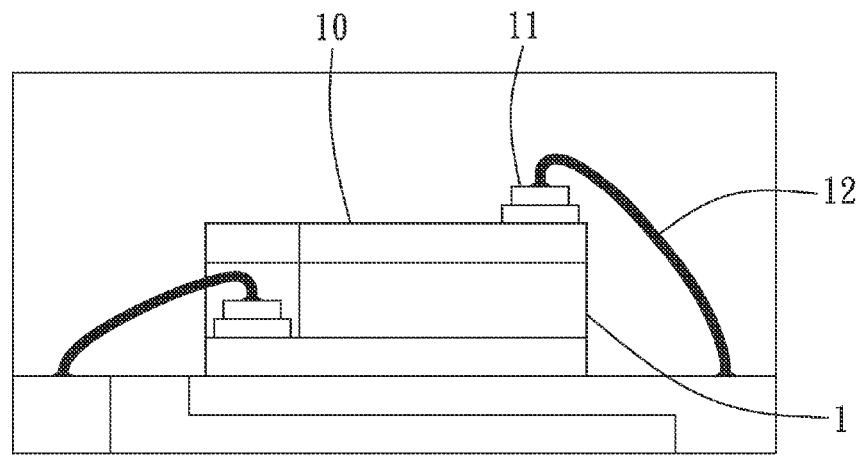
FIG. 1 is schematic side view of a conventional light-emitting device.
Figure 2:
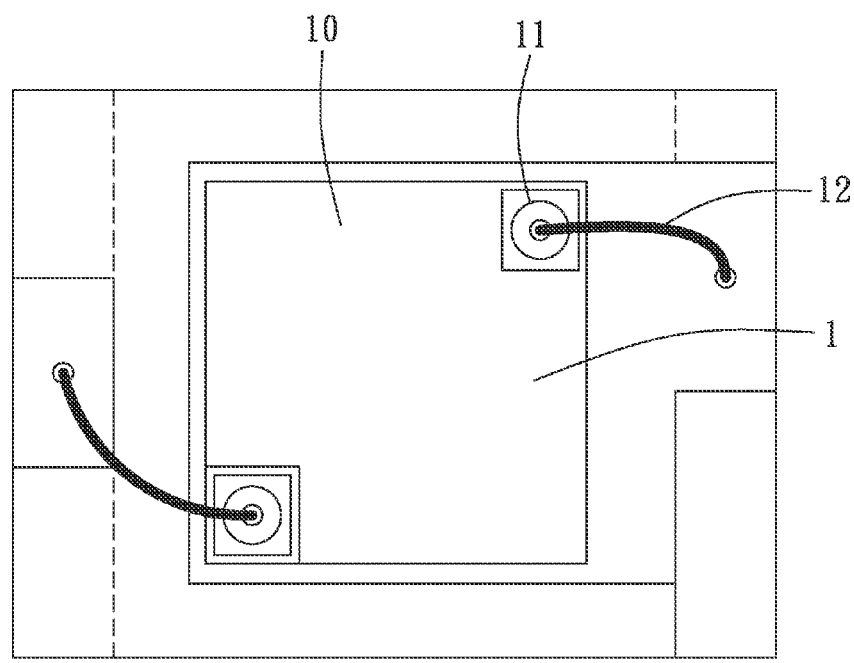
FIG. 2 is a schematic top view of the conventional light-emitting device of FIG. 1.

Before the present invention is described in greater detail, it should be noted that like-components are assigned the same reference numerals throughout the following disclosure.

Figure 3:
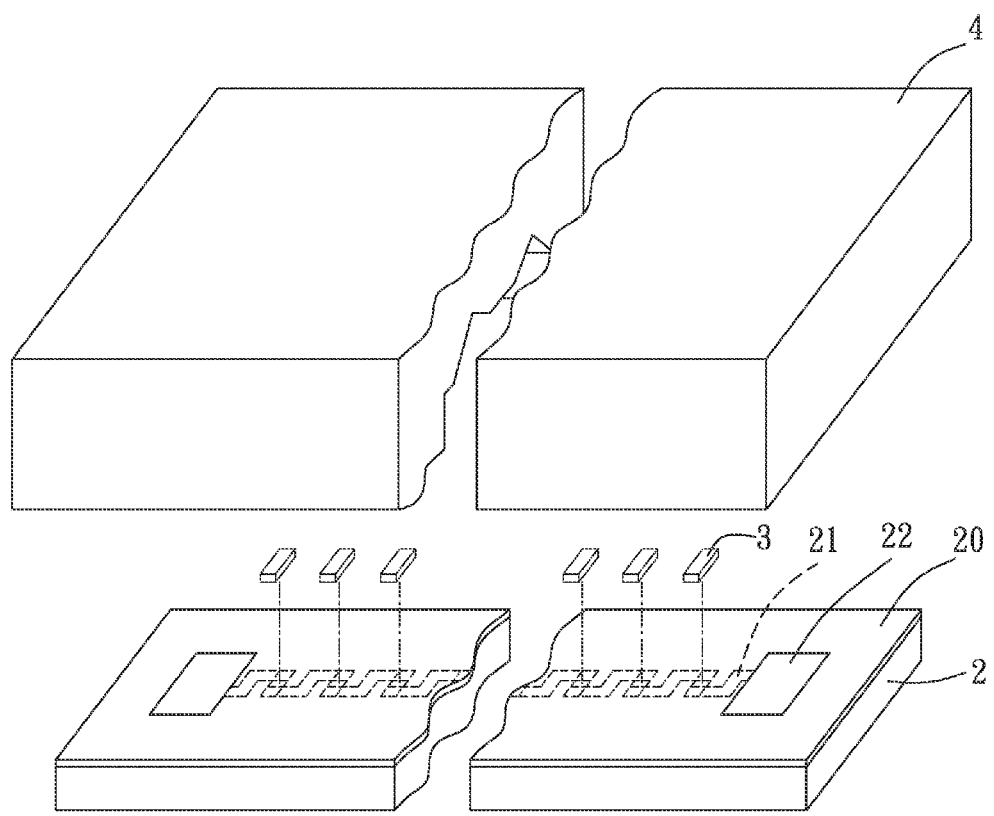
FIG. 3 is a fragmentary exploded perspective view of the first preferred embodiment of a light-emitting device according to the present invention.

FIG. 3 is an exploded perspective view of the first preferred embodiment of a light-emitting device according to the present invention.

Figure 4:
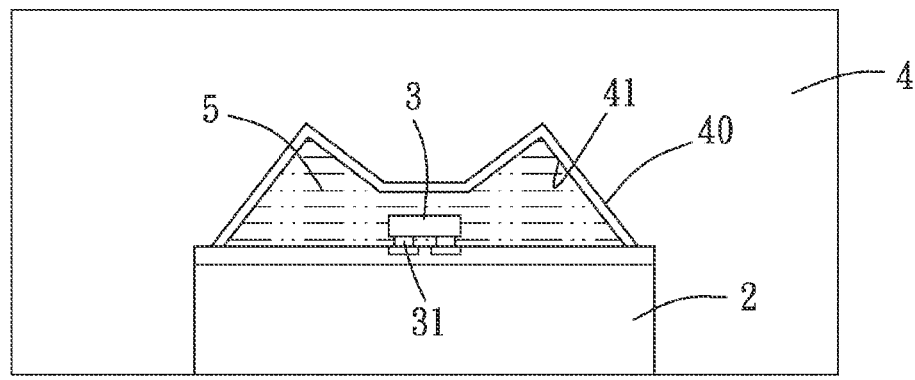
FIG. 4 is a schematic side view of the light-emitting device of the first preferred embodiment.

As shown in FIGS. 3 and 4, in the first preferred embodiment, the light-emitting device of this invention comprises a transparent substrate 2, a plurality of light-emitting diode chips 3, and a reflecting cup 4.

In this embodiment, the transparent substrate 2 is made of glass. Alternatively, the transparent substrate 2 may be made of any other suitable materials as long as it is sufficiently light-transmissible. Preferably, the transparent substrate 2 is made of a material that has light-transmission and heat dissipation properties. The transparent substrate includes a mounting surface 20, a circuit path 21 formed on the mounting surface 20, and two opposite contacts 22 formed on the mounting surface 20 to respectively electrically connect to two opposite ends of the circuit path 21. In this embodiment, the circuit path 21 is made from indium tin oxide (ITO).

Each of the light-emitting diode chips 3 includes two electrodes 31 and may be mounted on the mounting surface 20 of the transparent substrate 2. In any suitable manner such that the electrodes 31 are electrically connected to the circuit path 21. In this embodiment, the light-emitting diode chips 3 are flip-chip mounted on the mounting surface 20. Of course, the light-emitting diode chips 3 may be mounted on the mounting surface 20 by wire bonding.

The reflecting cup 4 is disposed on the mounting surface 20 to cover the light-emitting diode chips 3 in a manner that the contacts 22 are completely or partly exposed from the reflecting cup 4, thereby allowing the contacts 22 to electrically connect to an external circuit (not shown). The reflecting cup 4 may be made of any suitable material that has a good heat-dissipation effect. In addition, the reflecting cup 4 is formed with an inner recess 40 that faces the mounting surface 20, and a reflecting layer 41 formed on a recess-defining wall that defines the inner recess 40. The reflecting layer 41 is capable of reflecting light from surfaces of the light-emitting diode chips 3 toward the transparent substrate 2.

In this embodiment, the inner recess 40 has a cross-section in a substantially inverted. W-shape. It is noted that the inner recess 40 may have a cross-section in a substantially inverted V-shape. Alternatively, the inner recess 40 may have a cross-section in any other shape as long as the reflecting layer 41 is capable of reflecting light from the light-emitting diode chips 3 toward the transparent substrate 2.

In this embodiment, a heat-dissipation filler 5 that is made of a heat-dissipating material is filled in a space cooperatively defined by the reflecting layer 41 on the recess-defining wall and the mounting surface 20. The heat-dissipation filler 5 may be in a liquid, solid, vapor, or gel-like form.

Figure 5:
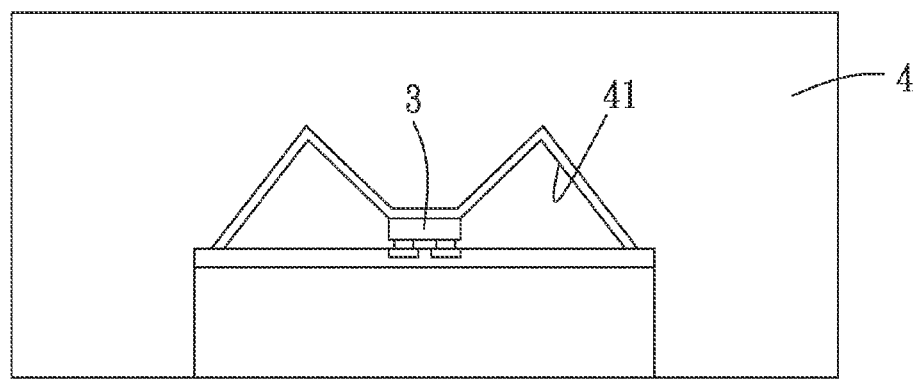
FIG. 5 is a schematic side view of a modification of the first preferred embodiment.

FIG. 5 shows a modification of the first preferred embodiment. Specifically, as shown in FIG. 5, a portion of the reflecting layer 41 on the recess-defining wall of the reflecting cup 4 contacts the light-emitting diode chips 3, thereby facilitating heat dissipation. In this modification, since a part of the reflecting layer 41 is in contact with the light-emitting diode chips 3, there is no need for filling a heat-dissipation filler 5 in the space cooperatively defined by the reflecting layer 41 and the mounting surface 20. Of course, the heat-dissipation filler 5 may also be added in the space.

By virtue of the abovementioned structure, since the light from the light-emitting diode chips 3 may be reflected toward the transparent substrate 2 through the reflecting cup 4, the light from the surfaces of the light-emitting diode chips 3 may be utilized effectively. Therefore, the light-emitting device of the present invention could have enhanced brightness.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A light-emitting device comprising:
   a transparent substrate including a mounting surface, a circuit path formed on said mounting surface, and two opposite contacts formed on said mounting surface to respectively connect to two opposite ends of said circuit path;
   a light-emitting diode chip that includes two electrodes and that is mounted on said mounting surface such that said electrodes are electrically connected to said circuit path; and
   a reflecting cup disposed on said mounting surface to cover said light-emitting diode chip in a manner that said contacts are exposed from said reflecting cup, said reflecting cup being formed with an inner recess that faces said mounting surface, and a reflecting layer formed on a recess-defining wall that defines said inner recess, said reflecting layer being capable of reflecting light from said light-emitting diode chip toward said transparent substrate.

2. The light-emitting device claim 1, further comprising a heat-dissipation filler that is filled in a space cooperatively defined by said reflecting layer on said recess-defining wall and said mounting surface.

3. The light-emitting device of claim 2, wherein said heat-dissipation filler is in one of liquid, solid, vapor, or gel-like form.

4. The light-emitting device of claim 1, wherein a portion of said reflecting layer on said recess-defining wall contacts said light-emitting diode chip.

5. The light-emitting device of claim 1, wherein said inner recess has a cross-section in a substantially inverted W-shape.

6. The light-emitting device of claim 1, wherein said inner recess has a cross-section in a substantially inverted V-shape.

7. The light-emitting device of claim 1, wherein said light-emitting diode chip is flip-chip mounted on said mounting surface.

* * * * *